(12) United States Patent
Akins, III (10) Patent No.: US 11,489,604 B2
(45) Date of Patent: *Nov. 1, 2022

(54) MAINTAINING SYNCHRONIZATION IN WIRELESS NETWORKS

(71) Applicant: Cisco Technology, Inc., San Jose, CA (US)

(72) Inventor: Glendon L. Akins, III, Fort Collins, CO (US)

(73) Assignee: Cisco Technology, Inc., San Jose, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 16/748,643

(22) Filed: Jan. 21, 2020

(65) Prior Publication Data

US 2020/0162177 A1 May 21, 2020

Related U.S. Application Data

(63) Continuation of application No. 15/727,352, filed on Oct. 6, 2017, now Pat. No. 10,541,769.

(51) Int. Cl.
| | |
|---|---|
| *H04J 3/06* | (2006.01) |
| *H04L 7/00* | (2006.01) |
| *H03M 13/00* | (2006.01) |
| *H03M 13/09* | (2006.01) |
| *H04L 1/00* | (2006.01) |

(52) U.S. Cl.
CPC ........... *H04J 3/0638* (2013.01); *H03M 13/09* (2013.01); *H03M 13/6356* (2013.01); *H04L 7/0008* (2013.01); *H04L 1/0061* (2013.01)

(58) Field of Classification Search
CPC .. H04J 3/0638; H03M 13/09; H03M 13/6356; H04L 7/0008; H04L 1/0061
See application file for complete search history.

(56) References Cited

U.S. PATENT DOCUMENTS

| | | | |
|---|---|---|---|
| 6,230,014 B1 | 5/2001 | Freeze et al. | |
| 6,430,193 B1* | 8/2002 | Raissinia | H04W 28/065 |
| | | | 370/448 |
| 7,606,266 B2* | 10/2009 | Abrol | H04L 69/324 |
| | | | 370/470 |
| 8,732,542 B2 | 5/2014 | Nebat et al. | |
| 9,686,055 B2 | 6/2017 | Khoryaev et al. | |
| 2005/0036512 A1 | 2/2005 | Loukianov | |
| 2005/0169302 A1* | 8/2005 | Lee | H04Q 11/0067 |
| | | | 370/465 |
| 2008/0280586 A1* | 11/2008 | Den Ouden | G08C 17/02 |
| | | | 455/352 |

(Continued)

*Primary Examiner* — Luat Phung
(74) *Attorney, Agent, or Firm* — Patterson + Sheridan, LLP (57) ABSTRACT

The present disclosure discloses a system including a controller and a plurality of radio heads communicatively coupled to the controller. The controller transmits a synchronization signal to each of the radio heads to synchronize the local clocks in the radio heads to a master clock in the controller. The controller also transmits packets to the radio heads. Each of the radio heads includes a deframer. For a radio head, upon detecting that a received packet from the controller includes an error, the deframer alters the received packet to maintain the synchronization between the controller and the radio head and transmits data contained within the altered packet.

20 Claims, 8 Drawing Sheets

(56) References Cited

U.S. PATENT DOCUMENTS

| | | | |
|---|---|---|---|
| 2009/0287985 A1* | 11/2009 | Okabe | G06F 11/1008 |
| | | | 714/807 |
| 2010/0316387 A1 | 12/2010 | Suvakovic | |
| 2011/0170527 A1* | 7/2011 | Yamamoto | H04W 56/0035 |
| | | | 370/338 |
| 2012/0141139 A1* | 6/2012 | Bakhru | H04B 10/272 |
| | | | 398/158 |
| 2012/0243559 A1* | 9/2012 | Pan | H04J 3/1605 |
| | | | 370/503 |
| 2015/0139251 A1* | 5/2015 | Tzeng | H04L 43/106 |
| | | | 370/503 |
| 2018/0351676 A1 | 12/2018 | Butterworth et al. | |
| 2019/0109660 A1 | 4/2019 | Akins, III | |

\* cited by examiner

MAINTAINING SYNCHRONIZATION IN WIRELESS NETWORKS

CROSS-REFERENCE TO RELATED APPLICATIONS

This application is a continuation of co-pending U.S. patent application Ser. No. 15/727,352, filed Oct. 6, 2017. The aforementioned related patent application is herein incorporated by reference in its entirety.

BACKGROUND

When transmitting Ethernet packets on Ethernet links between a central controller and a radio head, synchronization is usually required between these devices. That is, the clock in the central controller should be synchronized in time and/or frequency with the clock in the radio head. However, errors in the Ethernet packets may cause a loss of synchronization between the central controller and the radio head, which negatively affects the reliability of the transmission. If the synchronization between the transmitter and the receiver is lost, the system performs a restart and/or a recalibration process to recover the synchronization, which consumes power and causes delays. Thus, loss of synchronization between the central controller and the radio head should be avoided.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure discloses a system. The system comprises a controller and a plurality of radio heads communicatively coupled to the controller. The controller is configured to: transmit a synchronization signal to each of the plurality of radio heads to synchronize respective local clocks in the plurality of radio heads to a master clock in the controller; and transmit packets to the plurality of radio heads. Each of the plurality of radio heads comprises a deframer. The deframer is configured to: upon detecting that a received packet from the controller includes an error, alter the received packet to maintain the synchronization between the controller and the radio head; and transmit data contained within the altered packet.

One embodiment presented in this disclosure discloses a network device. The network device comprises: a processor and a deframer coupled to the processor. The processor is configured to transmit a synchronization signal to each of a plurality of radio heads. The deframer is configured to, upon detecting that a received packet from a first radio head of the plurality of radio heads includes an error, alter the received packet to maintain the synchronization between the network device and the first radio head; and transmit data contained within the altered packet to the processor.

One embodiment presented in this disclosure discloses a method. The method comprises: transmitting a synchronization signal from a network device to each of a plurality of radio heads; receiving packets from the plurality of radio heads; upon detecting that a received packet from a first radio head of the plurality of radio heads includes an error, altering the received packet to maintain the synchronization between the network device and the first radio head; and transmitting data contained within the altered received packet.

Example Embodiments

In one embodiment, Access Points (APs) used in Wi-Fi networks are part of a distributed system. The distributed system includes at least one central controller and one or more radio heads (RHs) that are distributed at different physical locations. The RHs are usually connected to the central controller through Ethernet links. Data is transmitted between a RH and the central controller through the Ethernet links using Ethernet packet format (e.g., IEEE 802.3 packet format). When data is transmitted between a RH and the central controller, errors may occur on the Ethernet links, i.e., the central controller and/or the RH may receive Ethernet packets that have errors. These errors may cause loss of synchronization between the RH and the central controller, which may require a restart and/or a recalibration of the distributed system. The present disclosure provides embodiments for handling the erroneous Ethernet packets transmitted between a RH and a central controller to maintain the synchronization between the RH and the central controller.

Figure 1:
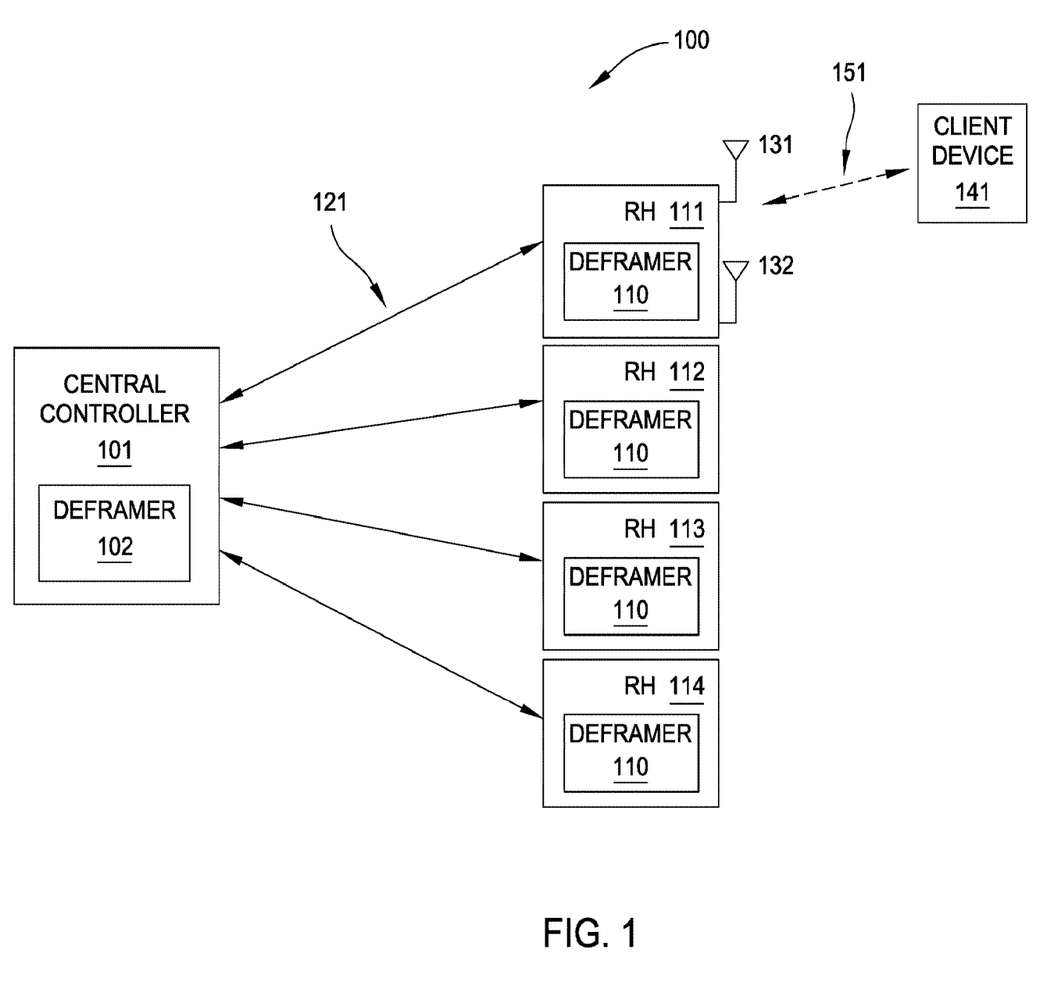
FIG. 1 illustrates a distributed system including a central controller controlling multiple radio heads (RHs), according to one embodiment herein.

FIG. 1 illustrates a distributed system 100, according to one embodiment herein. The distributed system 100 includes a central controller 101 and multiple RHs, e.g., RHs 111, 112, 113 and 114. In one embodiment, the RHs 111-114 are physically connected to the central controller 101 through wired connections 121. However, if power and latency requirements permit (e.g., for radio protocols that are more tolerant of high latencies), the RHs 111-114 may be daisy chained.

In one example, the connections 121 can be Ethernet cables such as Cat5e/6/6a Ethernet cables using 10GBASE-T/NBASE-T. In another example, the connections 121 can be fiber-optic links using 10GBASE-SR/10GBASE-LR. In one embodiment, the RHs 111-114 are distributed at different geographic locations in an area, e.g., a building. In one embodiment, the wired connections 121 can be up to 100 meters.

The central controller 101 includes a deframer 102. The central controller 101 receives Ethernet packets from one or more of the RHs 111-114 through the connections 121. If the deframer 102 detects that a received Ethernet packet from a RH, e.g., the RH 111, includes one or more errors, the deframer 102 alters the erroneous received Ethernet packet to maintain the synchronization between central controller 101 and the RH, e.g., the RH 111. In one embodiment, the deframer 102 is hardware circuitry which is part of an integrated circuit of the central controller 101.

Each of the RHs 111-114 also includes a deframer 110. In one embodiment, a RH, e.g., the RH 111, receives Ethernet packets from the central controller 101 through the connections 121. If the deframer 110 detects that a received Ethernet packet from the central controller 101 includes one or more errors, the deframer 110 alters the erroneous received Ethernet packet to maintain the synchronization between central controller 101 and the RH, e.g., the RH 111. In one embodiment, the deframer 110 is hardware circuitry which is part of an integrated circuit of the RH.

In one embodiment, each of the RHs 111-114 includes one or more antennas. For example, as shown in FIG. 1, the RH 111 includes two antennas 131 and 132. The RH, e.g., the RH 111, can transmit RF wireless signals through the antennas to a client device, e.g., the client device 141. Also, the RH can receive RF wireless signals from the client device. The communication between the RH 111 and the client device 141 is denoted by the bi-directional arrow 151.

In one embodiment, in the distributed system 100, functions of an AP are split into two parts. The central controller 101 provides part or all of the digital part of the physical (PHY) layer function for baseband processing (e.g., channel coding) and the media access control (MAC) layer function (e.g., collision avoidance) of an AP. Each RH provides the analog part of the PHY layer function for transmitting and receiving RF signals in a frequency band, plus associated digital signal processing (e.g., up-sampling and Q-to-I calibration).

In one embodiment, the central controller 101 does not perform the analog part of the PHY layer function of an AP, i.e., only the RHs 111-114 include and perform the analog part of the PHY layer function of an AP, e.g., transmitting and receiving RF signals in a frequency band. In one embodiment, the RHs 111-114 do not perform the digital part of the PHY layer function and the MAC layer function of an AP, i.e., only the central controller 101 includes and performs the digital part of the PHY layer function and the MAC layer function of an AP. In one embodiment, part or all of the digital part of the PHY layer function may also be included in the RHs depending on system partitioning.

FIG. 1 shows only one embodiment. In other embodiments, the distributed system 100 includes multiple central controllers. Each of the multiple central controllers can control one or more RHs. The multiple central controllers can be connected with each other. Further, each RH can include a different number of antennas.

Figure 2:
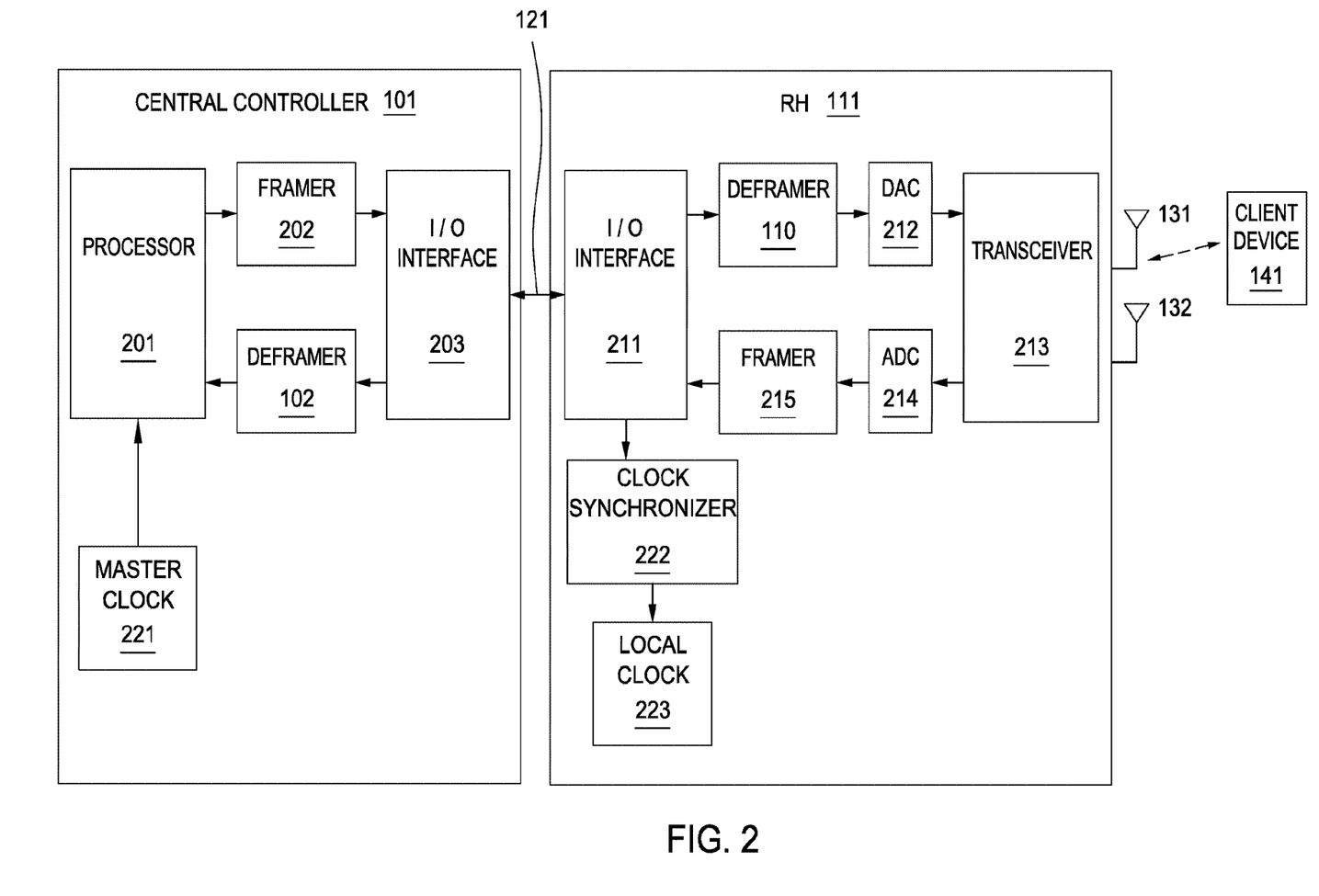
FIG. 2 illustrates data transmissions between the central controller and a RH through Ethernet links, according to one embodiment herein.

FIG. 2 illustrates data transmissions between the central controller 101 and the RH 111, through Ethernet links, according to one embodiment herein. The central controller 101 includes a processor 201. In one embodiment, the processor 201 is included in a software-defined radio (SDR). The processor 201 generates digital samples representing data to be transmitted to a client device. In one embodiment, the processor 201 generates digital samples according to a master clock 221 in the processor 201. For example, the master clock 221 provides a clock signal with a clock frequency (e.g., 160 MHz) to the processor 201, which generates digital samples at the rising or falling edge of the clock signal. In one embodiment, the master clock 221 includes a temperature controlled crystal oscillator.

The processor 201 transmits the digital samples to a framer 202 in the central controller 101. In one embodiment, the framer 202 formats the digital samples into Ethernet packets (i.e., digital samples in the format of Ethernet packets) and transmits the Ethernet packets to the I/O interface 203. In one embodiment, the I/O interface 203 includes a PHY/MAC interface for Ethernet such as the Universal Serial 10 Gigabit Media Independent Interface (USXGMII). The I/O interface 203 transmits the Ethernet packets to the I/O interface 211 of the RH 111 through the wired connections 121. In one embodiment, the I/O interface 211 of the RH 111 includes PHY/MAC interface for Ethernet such as the USXGMII.

The I/O interface 211 transmits the received Ethernet packets to the deframer 110 of the RH 111. In one embodiment, the deframer 110 detects if the received Ethernet packets include errors. For example, the errors may include lost or missing packet words in the received Ethernet packets, receiving unexpected extra packet words in an Ethernet packet, or receiving packet words later than expected. The errors may occur when the Ethernet packets are transmitted from the I/O interface 203 to the I/O interface 211 on the wired connections 121. If the deframer 110 detects that a received Ethernet packet from the central controller 101 includes one or more errors, the deframer 110 alters the erroneous received Ethernet packet to maintain the synchronization between the central controller 101 and the RH 111.

The deframer 110 parses the received Ethernet packets (including both altered and non-altered Ethernet packets) and deframes the Ethernet packets into digital samples. The deframer 110 transmits the digital samples (not in the format of Ethernet packets) to the DAC 212 of the RH 111. The DAC 212 performs digital-to-analog conversion to generate analog baseband signals and transmits the analog baseband signals to the transceiver 213 of the RH 111. The transceiver 213 modulates the analog baseband signals to generate RF signals and transmits the RF signals to the client device 141 through the antennas 131 and 132.

In one embodiment, a client device, e.g., the client device 141, transmits data to the central controller 101 via the RH 111. The client device 141 transmits data carried by RF signals to the RH 111, which receives the RF signals through antennas 131 and 132. The transceiver 213 demodulates the received RF signals to generate baseband analog signals and transmits the baseband analog signals to the ADC 214 of the RH 111. The ADC 214 performs analog-to-digital conversion to generate digital samples representing the data to be transmitted to the central controller 101. The ADC 214 transmits the digital samples to the framer 215 of the RH 111. The framer 215 formats the digital samples into Ethernet packets (e.g., IEEE 802.3 packets) and transmits the Ethernet packets to the I/O interface 211. The I/O interface 211 transmits the Ethernet packets to the I/O interface 203 of the central controller 101 through the wired connections 121.

The I/O interface 203 transmits the Ethernet packets to the deframer 102 of the central controller 101. In one embodiment, the deframer 102 detects if the received Ethernet packets include errors. The errors may occur when the Ethernet packets are transmitted from the I/O interface 211 to the I/O interface 203 on the wired connections 121. That is, error can occur in the Ethernet packets when transmitted packets from the central controller 101 to the RHs and when transmitting the packets from the RHs to the central controller 101. If the deframer 102 detects that a received Ethernet packet from the RH 111 includes one or more errors, the deframer 102 alters the erroneous received Ethernet packet to maintain the synchronization between central controller 101 and the RH 111.

The deframer 102 parses the received Ethernet packets (including both altered and non-altered Ethernet packets) and deframes the Ethernet packets into digital samples. The deframer 102 transmits the digital samples (not in the format of Ethernet packets) to the processor 201 for processing.

In one embodiment, the central controller 101 and the RH 111 are synchronized in frequency and/or time. The synchronization between the central controller 101 and the RHs is described in details below.

FIG. 2 shows only one embodiment. In other embodiments, data transmissions between the central controller 101 and other RHs, e.g., RHs 112-114, are performed similarly as described. In other embodiments, other RHs, e.g., RHs 112-114, may include the same or similar components as the RH 111. In other embodiments, the central controller 101 and/or the RHs may include other components such as memory elements.

Figure 3:
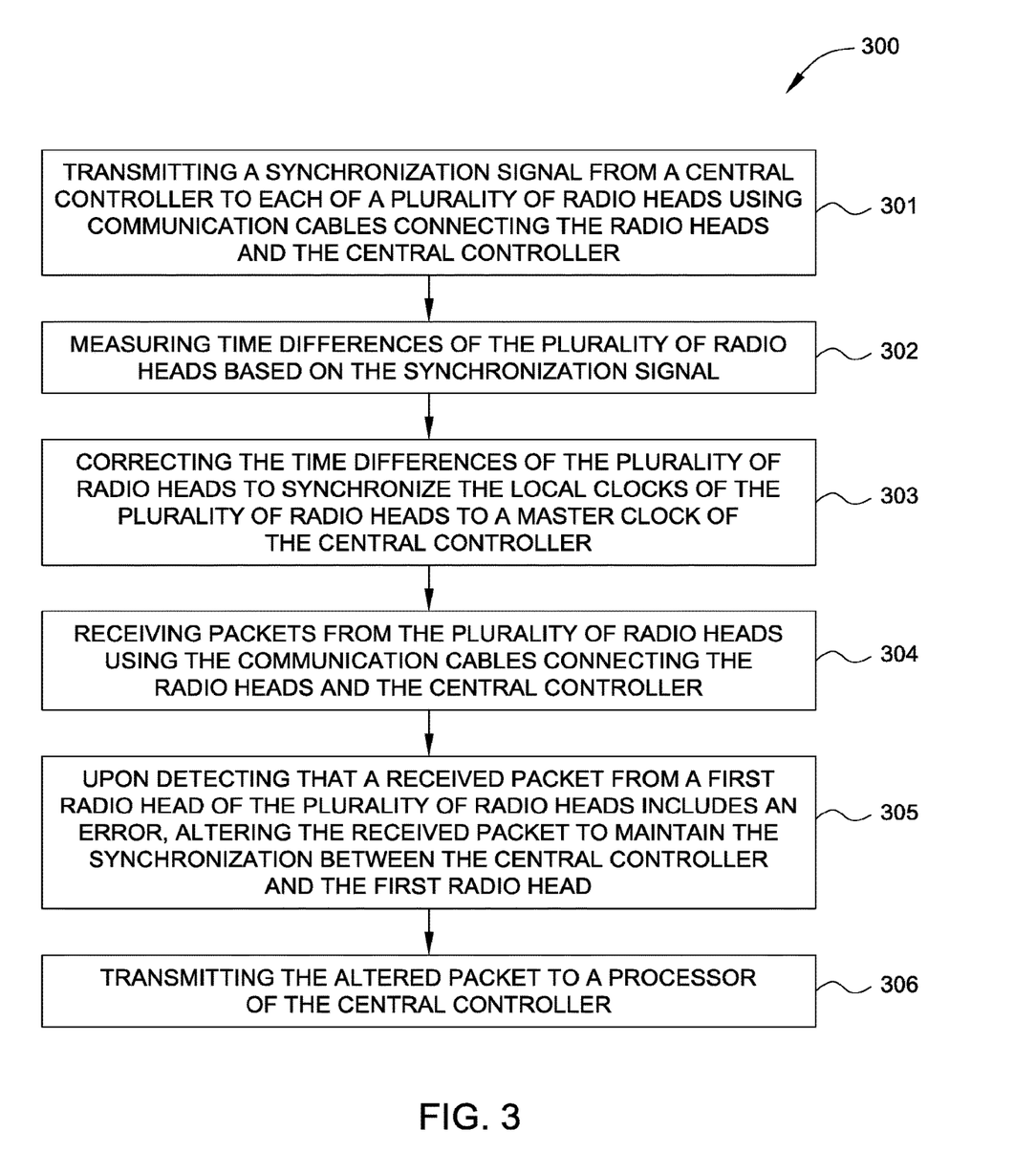
FIG. 3 illustrates a flowchart of a method to achieve and maintain the synchronization between the central controller and the RHs, according to one embodiment herein.

FIG. 3 illustrates a flowchart of a method 300 to achieve and maintain the synchronization between the central controller 101 and the RHs, according to one embodiment herein. The method 300 will be described using FIG. 2.

At block 301, the central controller 101 transmits one or more synchronization signals to each of the RHs 111-114 using communication cables (the wired connections 121) connecting the RHs and the central controller 101.

In one embodiment, the RHs and the central controller 101 are synchronized in frequency. For example, the master clock 221 in the central controller 101 has the same clock frequency as the local clock 223 in the RH 111. In one example, to achieve frequency synchronization, the central controller 101 can transmit a frequency synchronization signal, e.g., a bit stream, to the RH 111. The bit stream includes information of the clock frequency of the master clock 221. Using the information included in the bit stream, the clock synchronizer 222 of the RH 111 can adjust the local clock 223 in the RH 111 to have the same clock frequency as the master clock 221 in the central controller 101. For example, the clock synchronizer 222 of the RH 111 can adjust the local clock 223 using phase-locked loop (PLL) technologies, as understood in the art. The central controller 101 and other RHs, e.g., RHs 112-114, can be synchronized in frequency similarly.

In one embodiment, the central controller 101 and the RHs are also required to be synchronized in time. That is, the master clock 221 in the central controller 101 should have the same time, e.g., the same Coordinated Universal Time (UTC), as the local clocks in the RHs.

In one embodiment, the processor 201 of the central controller 101 generates the time synchronization signal. In one embodiment, the time synchronization signal includes timing information of the master clock 221 such as the UTC time that the master clock 221 is using. After receiving the time synchronization signal, each of the RHs, e.g., the RHs 111-114, adjusts its local clock 223 to have the same time as the master clock 221 using the timing information included in the time synchronization signal. In one embodiment, the clock synchronizer 222 in each RH adjusts the local clock 223 for each RH.

In one embodiment, because the RHs are distributed at different locations and the wired connections 121 for each RH have different lengths, the time synchronization signal may arrive at different RHs at different times. In other words, there is a time difference between the master clock 221 and the local clock 223 of each RH such that the adjusted time of the local clock 223 of each RH is still slightly different from the time of the master clock 221. Thus, in order to achieve accurate time synchronization, the time differences between the RHs, e.g., RHs 111-114, and the central controller 101 should be corrected or compensated.

At block 302, the central controller 101 measures the time differences of the RHs. In one embodiment, the central controller 101 measures the time differences of the RHs using the time synchronization signal. For example, the central controller 101 can measure the time differences of the RHs by determining when the RHs receive the time synchronization signal. The RHs may send a feedback signal to the central controller 101 after receiving the time synchronization signal. In another embodiment, the central controller 101 can send a separate or dedicated measurement signal for measuring the time differences of the RHs.

At block 303, the central controller 101 corrects the time differences of the RHs to synchronize the local clocks of the RHs to the master clock 221. In one embodiment, the central controller 101 corrects the time differences by compensating the time difference for each RH. After compensating for the time differences, the adjusted time of the local clock 223 of each RH is the same as the time of the master clock 221.

After the synchronization is achieved between the RHs and the central controller 101, the central controller 101 can transmit or receive data to or from the RHs. In one embodiment, at block 304, the central controller 101 receives Ethernet packets from the RHs using the wired connections 121. As explained above, errors may occur on the Ethernet links of the wired connections 121. In one embodiment, the central controller 101 may receive erroneous packets from the RHs, which may cause loss of synchronization between the central controller 101 and the RHs.

At block 305, upon detecting that a received packet from a first radio head, e.g., the RH 111, of the plurality of radio heads includes an error, the deframer 102 of the central controller 101 alters the received packet to maintain the synchronization between the central controller 101 and the first radio head. For example, the deframer 102 may detect erroneous packet words in the received Ethernet packets, lost or missing packet words in the received Ethernet packets, or unexpected extra packet words. The deframer 102 may also detect receiving packet words later than expected. Each type of error will be addressed in turn in the later figures. At block 306, the deframer 102 deframes the alter packet into digital samples and transmits the altered digital samples to the processor 201 of the central controller 101 for processing.

In one embodiment, the central controller 101 transmits Ethernet packets to the RHs using the wired connections 121. Similarly as described above, upon detecting that a received packet from the central controller 101 includes an error, the deframer 110 of the RH, e.g., the RH 111, alters the received packet to maintain the synchronization between the central controller 101 and the RH. The deframer 110 deframes the alter packet into digital samples and transmits the altered digital samples to the DAC 212 of the RH.

Embodiments of altering the erroneous packets to maintain the synchronization between the central controller 101 and a RH as described in block 305 are described in details below using FIGS. 4-7. When describing FIGS. 4-7, the data transmission is from the central controller 101 to a RH, e.g., the RH 111. Data transmission from a RH, e.g., the RH 111, to the central controller 101 is similar as understood by an ordinary person in the art.

Figure 4:
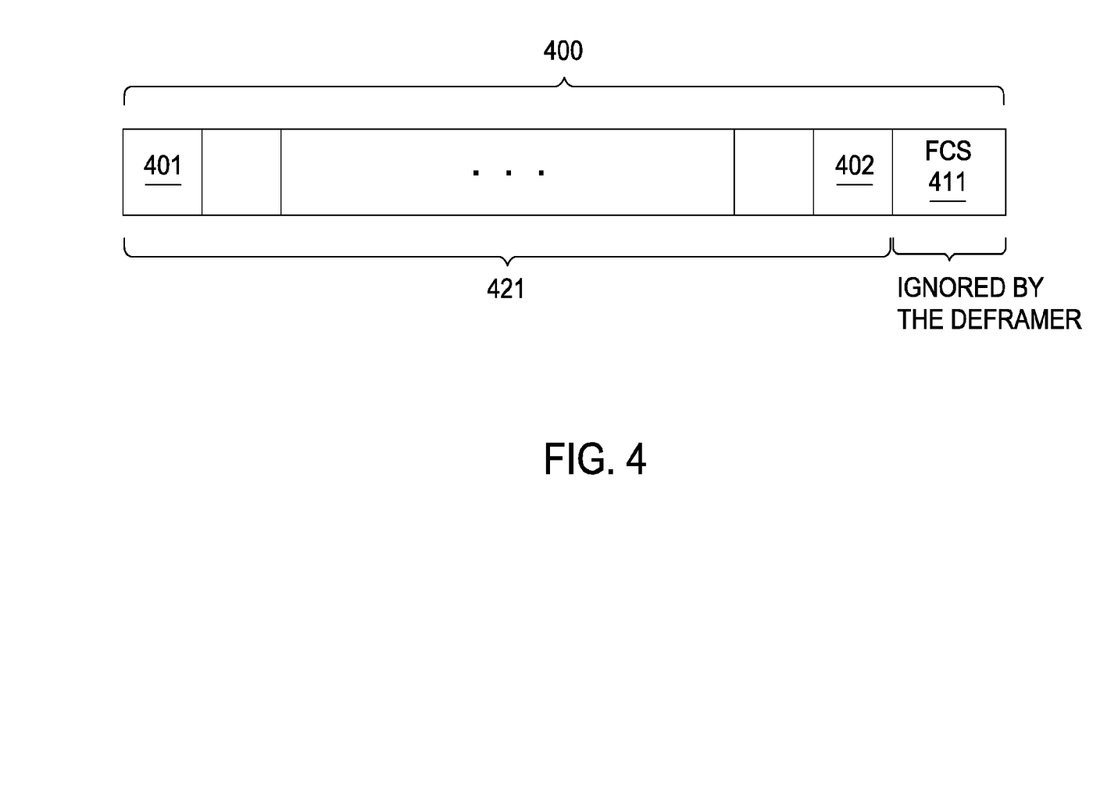
FIG. 4 illustrates altering a received packet to maintain the synchronization between the central controller and a RH, according to one embodiment herein.

FIG. 4 illustrates altering a received packet to maintain the synchronization between the central controller 101 and the RH 111, according to one embodiment herein. The deframer 110 of the RH 111, receives an Ethernet packet 400 from the central controller 101. The Ethernet packet 400 includes a data portion 421 and a frame check sum (FCS) portion 411. The data portion 421 includes multiple packet words such as packet words 401 and 402. Each packet word includes multiple bits, e.g., 16 bits. In one embodiment, the FCS portion 411 includes the cyclic redundancy check (CRC).

In one embodiment, the deframer 110 can detect that the start of the packet and the length of the packet are correct but that the FCS of the packet 400 indicates errors in the data portion 421. For example, the CRC in the FCS may indicate that the data portion 421 includes one or more erroneous packet words or erroneous bits in the packet words. The deframer 110 ignores or removes the FCS portion 411 and transmits the data portion 421 to the DAC 212 without the FCS portion 411. For example, the deframer 110 deframes the data portion 421 into digital samples and transmits the digital samples (including errors) to the DAC 212.

In one embodiment, the client device 141 treats the erroneous digital samples in the data portion 421 received from the RH as RF interference. Because the data represented by the digital samples in the data portion 421 is already heavily protected by forward error correcting (FEC) codes such as Reed Solomon code or low-density parity-check (LDPC) code before the digital-to-analog conversion, the client device 141 can recover the data by performing decoding of the FEC codes, as understood in the art. If the client device 141 does not receive the data successfully, the client device 141 can send a No-Acknowledge (NACK) signal to the central controller 101 to request retransmission of the data.

In the embodiment as shown in FIG. 4, the synchronization between the central controller 101 and the RH 111 is not lost due to the errors indicated by the FCS. That is, by forwarding the errors onto the client device, the central controller 101 and the RH 111 remain synchronized and do not negatively affect the client device.

Figure 5A:
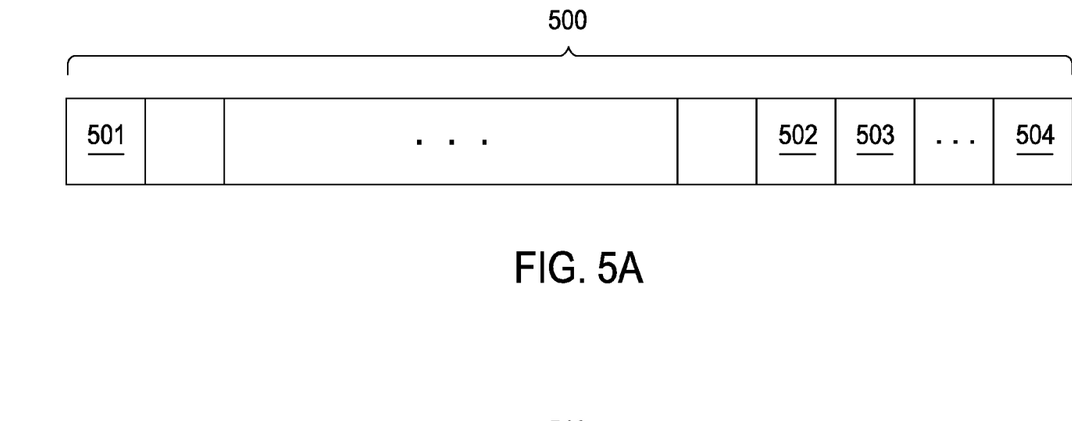
FIGS. 5A and 5B illustrate altering a received packet to maintain the synchronization between the central controller and a RH, according to one embodiment herein.
Figure 5B:
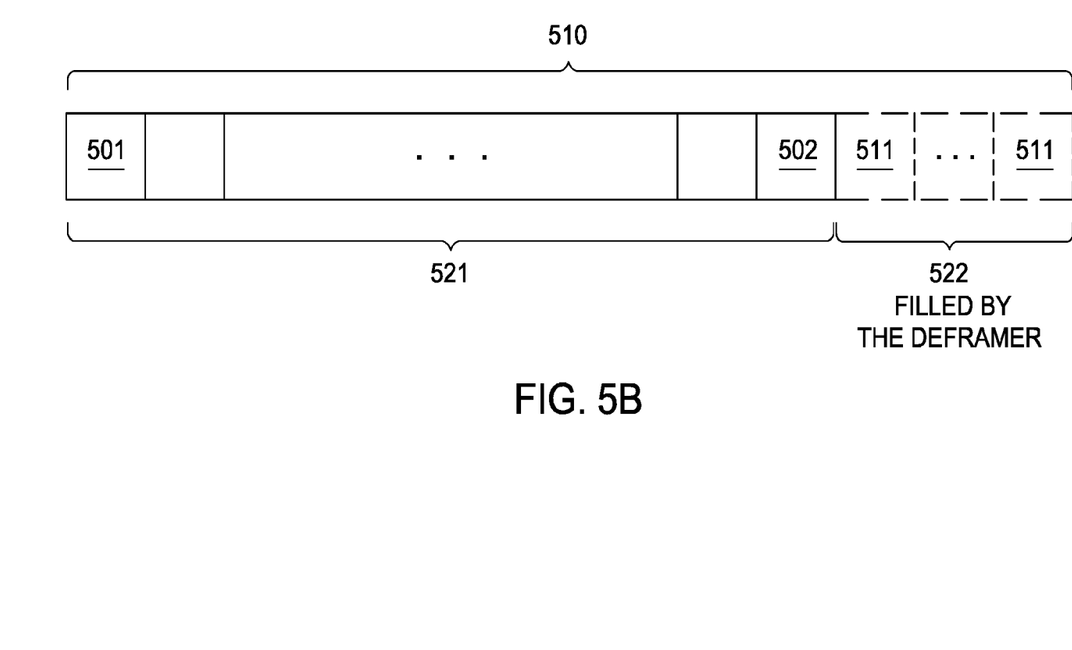

FIGS. 5A and 5B illustrate altering a received packet to maintain the synchronization between the central controller 101 and a RH, according to another embodiment herein. FIG. 5A illustrates that the deframer 110 of the RH 111 expects to receive an Ethernet packet 500 from the central controller 101. The expected packet 500 includes multiple packet words such as packet words 501-504, as shown in FIG. 5A. In one embodiment, the deframer 110 is pre-configured by the central controller 101 to have prior knowledge of the expected packet 500. For example, the deframer 110 may know information such as the start and the end of the packet, the length of the packet, the number of the packet words and the position of the packet words in the packet. Thus, the deframer 110 knows when each packet word in the packet 500 should be received. In one embodiment, the deframer 110 may include a counter to count the number and the order of packet words that the deframer 110 has received. For example, if the deframer 110 receives the first packet word in the packet, the counter value will be increased from 0 to 1 and so on.

FIG. 5B illustrates an example where the deframer 110 of the RH 111 receives a shorter packet 521 than expected. As shown, the shorter packet 521 includes only packet words from 501 to 502 and does not include packet words 503 to 504 as expected. In other words, the packet 500 ends earlier such that the deframer 110 expects but does not receive the packet words 503 to 504.

In one embodiment, the counter in the deframer 110 indicates that the expected packet words are not received, e.g., the counter value is not increased to the expected value. In one embodiment, when the deframer 110 expects to receive packet words 503 to 504 but does not receive the packet words 503 to 504, the RH 111 may send a signal to the central controller 101 to indicate that the synchronization between the RH 111 and the central controller 101 is lost. The central controller 101 may perform a restart and/or a recalibration process to recover the synchronization between the RH 111 and the central controller 101.

To avoid the restart and/or the recalibration process, in one embodiment, when the deframer 110 expects, but does not receive, the packet words 503 to 504, the deframer 110 generates null packet words 511 with zero bits or zero value digital samples to replace the lost packet words 503-504 until the expected packet length is achieved. As shown in FIG. 5B, the deframer 110 fills or appends null packet words 511 after the last received packet word 502 to generate a portion 522 where the deframer 110 expects to receive packet words 503 to 504. In this way, the deframer 110 actually receives a packet 510 which has the same length and the same number of packet words as the expected packet 500. The deframer 110 parses the packet 510 and transmits the digital samples in the packet 510 to the DAC 212. Similarly as described above, the client device 141 can treat the portion 522 in the packet 510 as RF interference.

In the embodiment as shown in FIG. 5B, because the deframer 110 receives the packet 510 with the expected packet length and the expected number of packet words, the deframer 110 determines that the RH 111 and the central controller 101 are still synchronized. Thus, the deframer 110 will not send a signal indicating loss of synchronization. In this way, the synchronization between the RH 111 and the central controller 101 is maintained and the central controller 101 does not need to perform restart and/or the recalibration process.

FIG. 5B shows only one embodiment. In other embodiments, the one or more lost packet words are in the middle of the packet. For example, the deframer 110 expects to receive packet word 502 but does not receive it. In this example, the deframer 110 receives the packet words before the lost packet word 502 and receives the packet words (e.g., packet words 503-504) after the lost packet word 502. The deframer 110 generates a null packet word to replace the lost packet word 502. In other words, the null packet word is generated in the middle of the packet to replace the lost packet word 502. In other embodiments, if an entire packet is lost, the deframer 110 generates a null packet with the same number of packet words as the lost packet to replace the lost packet.

Figure 6A:
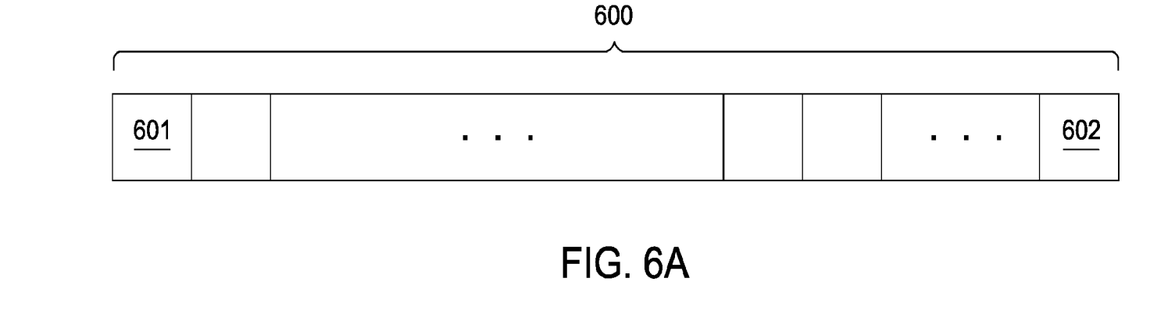
FIGS. 6A and 6B illustrate altering a received packet to maintain the synchronization between the central controller and a RH, according to another embodiment herein.
Figure 6B:
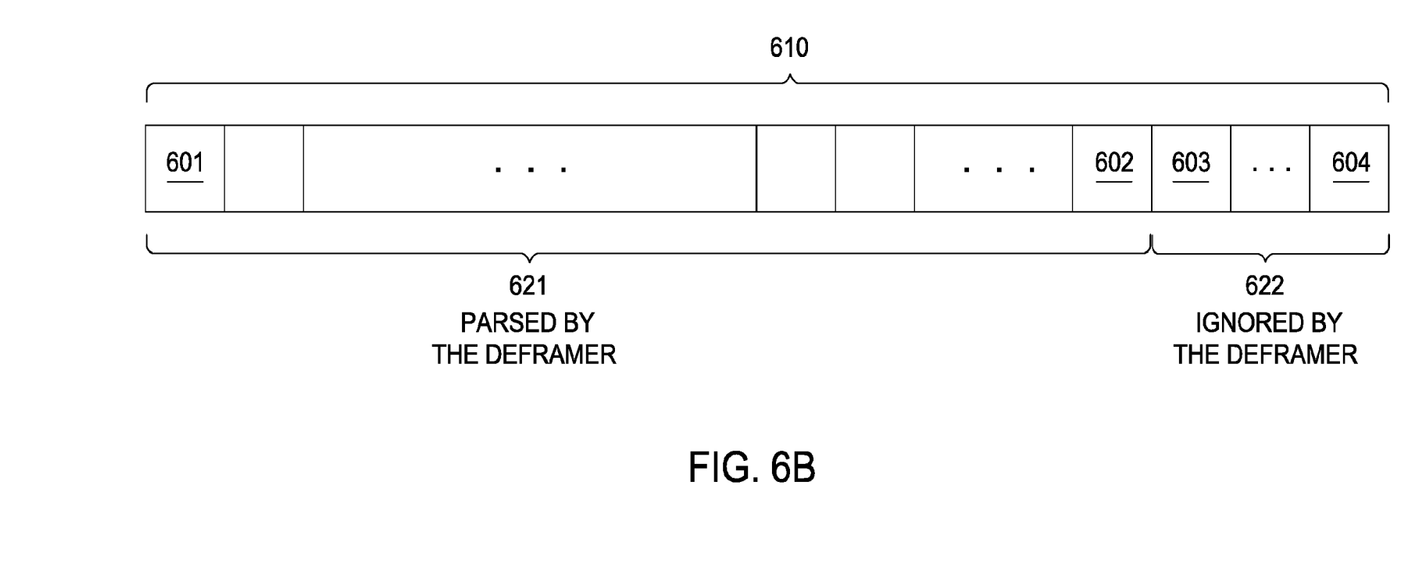

FIGS. 6A and 6B illustrate altering a received packet to maintain the synchronization between the central controller 101 and a RH, according to another embodiment herein. FIG. 6A illustrates that the deframer 110 of the RH 111 expects to receive an Ethernet packet 600 from the central controller 101. The expected packet 600 includes multiple packet words such as packet words 601-602, as shown. Similarly as described above, in one embodiment, the deframer 110 is trained or is configured by the central controller 101 to have prior knowledge of the expected packet 600. Thus, the deframer 110 knows when each of the packet words in the packet 600 should be received, e.g., by using a counter in the deframer 110.

FIG. 6B illustrates an example where the deframer 110 of the RH 111 receives a longer packet 610 including the expected packet words from 601 to 602 and unexpected extra packet words 603-604. In one embodiment, the counter in the deframer 110 indicates that extra packet words are received, e.g., the counter value is increased to be higher than the expected maximum value. Similarly as described above, in one embodiment, when the deframer 110 receives a longer packet 610, the RH 111 may send a signal to the central controller 101 to indicate that the synchronization between the RH 111 and the central controller 101 is lost.

To avoid the restart and/or the recalibration process for resynchronization, in one embodiment, the deframer 110 ignores or removes the extra packet words from 603-604 in the longer packet 610. As shown in FIG. 6B, the deframer 110 ignores the portion 622 including the extra packet words 603 to 604. In this way, the deframer 110 parses only the portion 621 of the longer packet 610 and transmits the digital samples corresponding to the portion 621 to the DAC 212. The portion 621 has the same length and includes the same packet words as the expected packet 600.

In the embodiment as shown in FIG. 6B, because the deframer 110 parses only the portion 621 including the expected packet length and the expected packet words, the synchronization between the RH 111 and the central controller 101 is maintained and the central controller 101 does not need to perform restart and/or the recalibration process.

Figure 7A:
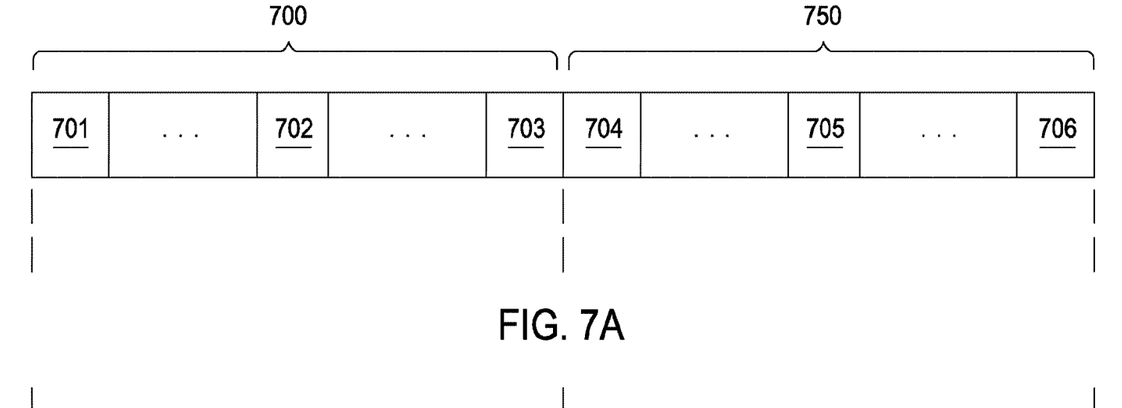
FIGS. 7A and 7B illustrate altering a received packet to maintain the synchronization between the central controller and a RH, according to another embodiment herein.
Figure 7B:
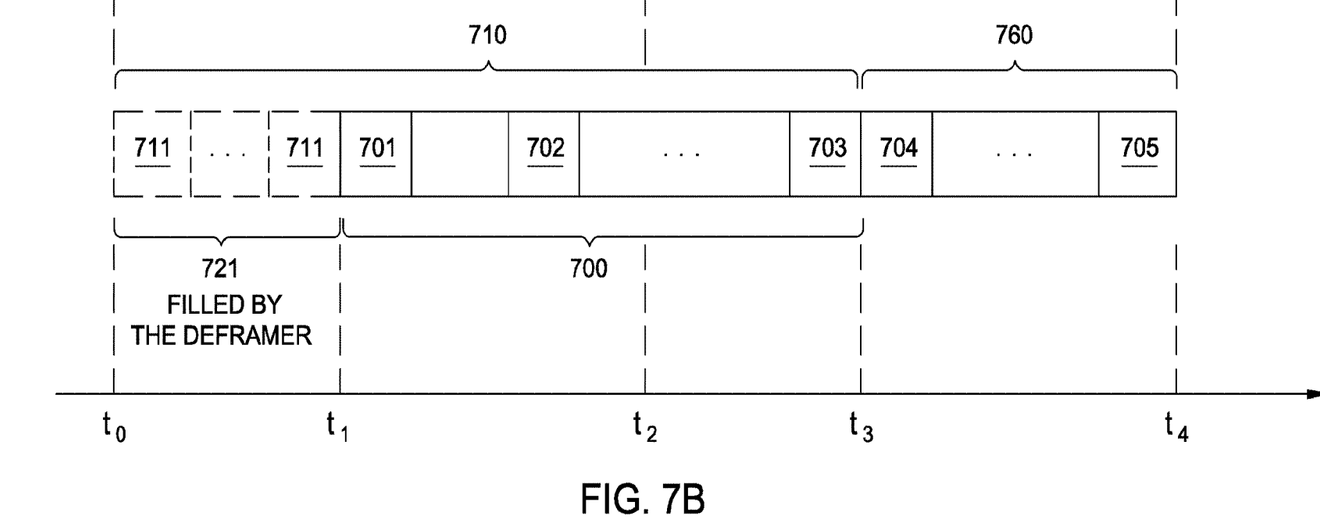

FIGS. 7A and 7B illustrate altering a received packet to maintain the synchronization between the central controller 101 and a RH, according to another embodiment herein. FIG. 7A illustrates that the deframer 110 of the RH 111 expects to receive an expected Ethernet packet 700 starting at time $t_0$ and an expected Ethernet packet 750 starting at time $t_2$ from the central controller 101. The expected packets 700 and 750 includes multiple packet words such as packet words 701, 702 703, 704, 705, and 706 as shown in FIG. 7A. Similarly as described above, in one embodiment, the deframer 110 is trained or configured by the central controller 101 to have prior knowledge of the expected packets 700 and 750. In one embodiment, the deframer 110 uses a counter (e.g., a sequence counter) that has prior knowledge of what packets should be received and at what times. That is, the counter can identify the order at which a plurality of expected packets should be received at the deframer 110. For example, using the counter, the deframer 110 can determine if a packet is missing (e.g., packet 750 is received without first receiving packet 700) or merely delayed (e.g., packet 700 arrives later than time $t_0$. Moreover, the deframer 110 may know when each of the packet words in the packets 700 and 750 should be received using the counter or based on the synchronized UTC.

FIG. 7B illustrates that the deframer 110 receives the packet 700 starting at time $t_1$ which is later than the expected time $t_0$. In other words, the deframer 110 expects to receive the first packet word 701 of the packet 700 at time $t_0$. However, the deframer 110 actually receives the first packet word 701 of the packet 700 at time $t_1$. In one embodiment, the counter in the deframer 110 indicates that the expected packet words are not received at the expected time, e.g., the counter value is not increased at the expected time.

To avoid the restart and/or the recalibration process for resynchronization, in one embodiment, when the deframer 110 does not receive the first packet word 701 at time $t_0$ as expected, the deframer 110 generates a null packet word 711 at time $t_0$. As shown in FIG. 7B, the deframer 110 fills null packet words 711 from time $t_0$ to time $t_1$ to generate a portion 721 until the packet word 701 is received at time $t_1$. In this way, the deframer 110 actually receives a long packet 710 which starts at the expected time $t_0$. The deframer 110 parses the long packet 710 and transmits the digital samples in the packet 710 to the DAC 212. Similarly as described above, the client device 141 can treat the portion 721 in the long packet 710 containing the null packet words 711 as RF interference.

However, inserting null packets 711 into the long packet 710 throws off the timing for the subsequently received packets. That is, the expected packet 750 can no longer be forwarded to the DAC at time $t_2$ but is delayed by same delay as was packet 700. To maintain synchronization, in one embodiment, the deframer 110 transmits a request to the central controller 101 to transmit a short packet 760 to compensate for the delay which is received at time $t_3$ which is after time $t_2$ when the expected packet 750 was scheduled to be received. For example, the deframer 110 may inform the central controller 101 how many null packet words 711 were inserted into the portion 721. In response, the central controller 101 generates and transmits the short packet 760 which is shorter by the same number of null packet words 711. In one embodiment, the central controller 101 can cut words in the short packet 760 which do not affect the client device 141. For example, the short packet 750 may not include the packet word 706 (as well as other packet words) which would have been sent but for the delay. As a result, the short packet 760 ends at time $t_4$ which is the same time the expected packet 750 was scheduled to end. In this manner, the deframer 110 maintains the synchronization and the central controller 101 does not need to perform restart and/or the recalibration process. Moreover, although FIGS. 7A and 7B illustrate receiving the short packet 760 immediately after receiving the long packet 710, in other example, the central controller 101 may send the short packet 760 in later, subsequent packets. As a result, the synchronization between the central controller 101 and the RH 111 may be off for a short time period until the short packet 760 is subsequently received. Nonetheless, the error correction algorithms in the client device 141 can handle any errors caused by this temporary mis-synchronization between the central controller 101 and the RH 111.

FIGS. 7A and 7B show only one embodiment. In other embodiments, the one or more late packet words are in the middle of the packet. For example, the deframer 110 receives the packet word 702 $t$ seconds later than expected. Stated differently, the deframer 110 may receive a first portion of the packet at the expected time, but then the packet word 702 is received later than expected. The deframer 110 generates one or more null packet words during the t seconds until the packet word 702 is received. In other words, the null packet words are generated and added in the middle of the packet. In other embodiments, if an entire packet is delayed by t seconds, the deframer 110 generates one or more null packets or packet words during the t seconds until the entire packet is received.

Figure 8A:
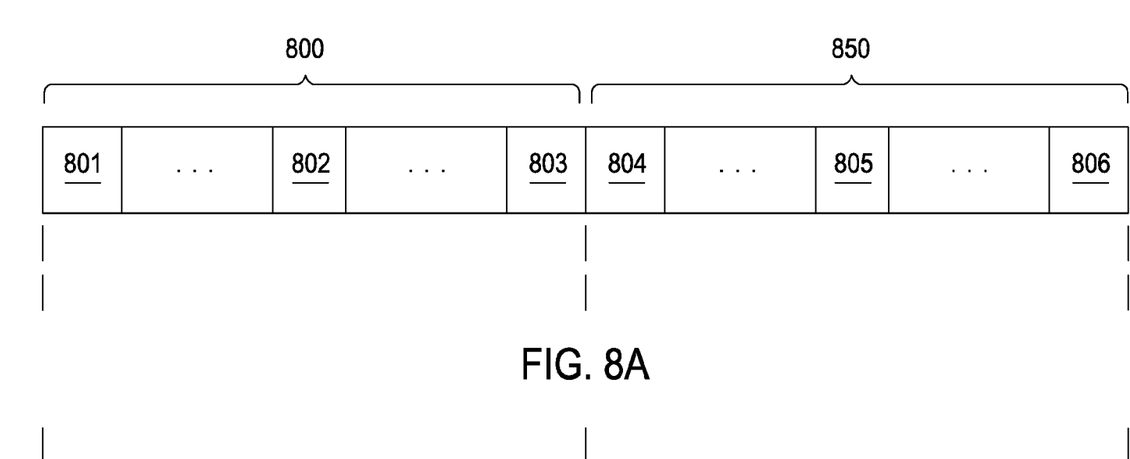
FIGS. 8A and 8B illustrate altering a received packet to maintain the synchronization between the central controller and a RH, according to another embodiment herein.
Figure 8B:
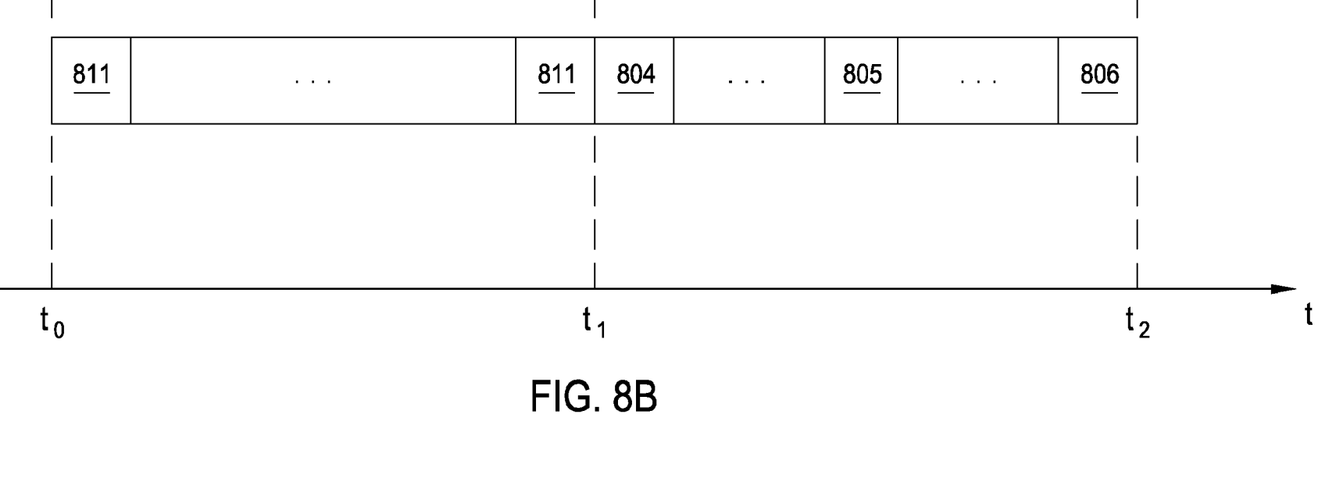

FIGS. 8A and 8B illustrate altering a received packet to maintain the synchronization between the central controller 101 and a RH, according to another embodiment herein. FIG. 8A illustrates that the deframer 110 of the RH 111 expects to receive an expected Ethernet packet 800 starting at time $t_0$ and an expected Ethernet packet 850 starting at time $t_1$ from the central controller 101. The expected packets 800 and 850 includes multiple packet words such as packet words 801, 802 803, 804, 805, and 806. As described above, in one embodiment, the counter in the deframer 110 has prior knowledge of what packets should be received at what times. Moreover, the deframer 110 may know when each of the packet words in the packets 700 and 750 should be received using the counter or based on the synchronized UTC.

FIG. 8B illustrates the scenario where an entire packet is not received at the deframer 110. That is, unlike in FIG. 7B where the expected packet 700 is delayed, in FIG. 8B, the expected packet 800 is not received at the deframer 110 at its schedule time. However, at time $t_0$ the deframer 110 may not know if the packet 700 is delayed or if the packet 700 will never be received (e.g., the packet was lost or dropped). In any case, as described above, the deframer 110 inserts null packet words 811 to fill in the delay caused by not yet receiving the word 801 in the expected packet 800.

At time $t_1$, the deframer 110 receives the first word 804 in the expected packet 850. Using the counter, the deframer 110 can detect that the expected word 800 was not received—i.e., was dropped or skipped. Moreover, the deframer 110 can determine that the expected word 850 was received at its scheduled time—i.e., time $t_1$. Thus, the deframer 110 can stop transmitting the null packet works 811 to the downstream logic (e.g., the DAC) and instead forward the packet word 804 in the expected packet 850. Because an entire packet 800 was not received, in this embodiment, the deframer 110 does not send a request to the central controller 101 to transmit a short packet since the synchronization between the RH 111 and the central controller 101 is still maintained. Instead, the error correction algorithms in the client device 141 can handle the fact that the packet 800 was never received. Moreover, the client device 141 or deframer 110 can request that the central controller 101 retransmit the packet that was not received.

FIGS. 4-8 only show embodiments of altering a received erroneous packet to maintain the synchronization between the central controller 101 and the RH 111 by the deframer 110 in the RH 111. In other embodiments, the deframer 111 in other RHs, e.g., RHs 112-114, can alter one or more received erroneous packets to maintain the synchronization between the central controller 101 and the corresponding RH similarly. In other embodiments, when data is transmitted from a RH, e.g., the RH 111, to the central controller 101, the deframer 102 in the central controller 101 can alter one or more received erroneous packets to maintain the synchronization between the central controller 101 and the RH similarly.

In one embodiment, the RH 111 also receives control information from the central controller 101. For example, the control information may include transmit gain level, receive gain levels, firmware images, transmit start signals, transmit stop signals, receive start signals, receive stop signals and other control information as understood in the art. When transmitting Ethernet digital samples carrying the control information on the wired connections 121, errors may occur as well. In one embodiment, the deframer 110 is pre-configured by the central controller 101 such that the deframer 110 knows whether a packet word includes control information or user data for the client device.

To protect the control information, in one embodiment, the central controller 101 uses a combination of parity, FEC, CRC, and redundancy. For example, the transmit start command is represented by a four bit command and a parity bit. The central controller 101 transmits the transmit start command (5 bits) four times to the RH 111. Each of these four commands may be separated from each other by more than one packet word. If errors do not occur in all of the four commands, the RH 111 will receive the transmit start command and place the radio head hardware in the transmit mode. If the RH 111 does not receive the transmit start command successfully from the central controller 101, the RH 111 will not transmit signals to the client device. The client device will send a NACK signal to the central controller 101, and the central controller 101 will retransmit the transmit start command to the RH 111 later.

In one embodiment, the control information includes long commands such as firmware images. The central controller 101 sends long commands less frequently than short commands. However, the central controller 101 provides stronger error detection and error correction to long commands than to short commands. For example, the central controller 101 splits a firmware image into fragments and intersperses the fragments with user data samples. The central controller 101 protects each fragment using a strong ECC such as Reed Solomon code. The RH 111 receives the fragments successfully and assembles the fragments into a firmware image. If the RH 111 does not receive one or more fragments successfully due to errors on the wired connections 121, the RH 111 can request the central controller 101 to retransmit the missed one or more fragments.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

I claim:

1. A system, comprising:
 a controller; and
 a plurality of wireless radio heads communicatively coupled to the controller, wherein the controller is configured to:
  transmit a synchronization signal to each of the plurality of wireless radio heads to synchronize respective local clocks in the plurality of radio heads to a master clock in the controller; and
  transmit packets to the plurality of radio heads;
 wherein each of the plurality of radio heads comprises a deframer configured to:
  upon detecting that a received packet from the controller includes an error that can lead to a loss of synchronization between the master clock of the controller and the local clock of a respective radio head, alter the received packet to prevent the error from leading to the loss of synchronization; and
  wirelessly transmit data contained within the altered packet to a wireless device.

2. The system of claim 1, wherein the received packet includes a data portion and a frame check sum (FCS) portion, and wherein the error indicates that the data portion includes one or more erroneous packet words, and wherein the deframer is further configured to remove the FCS portion and transmit only the data portion.

3. The system of claim 1, wherein the error indicates that the received packet is missing one or more packet words, and wherein the deframer is further configured to alter the received packet by generating one or more null packet words to replace the missing one or more packet words.

4. The system of claim 3, wherein the deframer is configured to:
upon determining that an expected packet is delayed, transmit an instruction to the controller requesting that the controller transmit a subsequent short packet that compensates for using the null packet words and maintains the synchronization.

5. The system of claim 3, wherein the deframer is configured to:
determining that an expected packet was not received using a sequence counter identifying an order of a plurality of expected packets to be received from the controller.

6. The system of claim 1, wherein the error indicates that the received packet includes expected packet words and one or more unexpected packet words, and wherein the deframer is further configured to alter the received packet by removing the unexpected packet words from the received packet and transmitting only the expected packet words.

7. The system of claim 1, wherein the error indicates that the received packet includes one or more packet words received later than an expected time, and wherein the deframer is further configured to alter the received packet by adding one or more null packet words at a front of the received packet.

8. The system of claim 1, wherein the controller and radio heads are communicatively coupled via Ethernet links.

9. The system of claim 1, wherein the controller is configured to provide part or all of a digital part of a physical (PHY) layer function of an access point (AP) without providing an analog part of the PHY layer function of an AP.

10. A network device, comprising:
a processor configured to transmit a synchronization signal to each of a plurality of radio heads, and receive packets from the plurality of radio heads;
a deframer coupled to the processor and configured to:
upon detecting that a received packet from a first radio head of the plurality of radio heads includes an error that can lead to a loss of synchronization between a master clock of the network device and a local clock of the first radio head, alter the received packet to prevent the error from leading to the loss of synchronization; and
transmit data contained with the altered received packet to the processor.

11. The network device of claim 10, wherein the received packet includes a data portion and a frame check sum (FCS) portion, and wherein the error indicates that the data portion includes one or more erroneous packet words, and wherein the deframer is further configured to remove the FCS portion and transmit only the data portion to the processor.

12. The network device of claim 10, wherein the error indicates that the received packet is missing one or more packet words, and wherein the deframer is further configured to alter the received packet by generating one or more null packet words to replace the missing one or more packet words.

13. The network device of claim 10, wherein the error indicates that the received packet includes expected packet words and one or more unexpected packet words, and wherein the deframer is further configured to alter the received packet by removing the unexpected packet words from the received packet and transmitting only the expected packet words to the processor.

14. The network device of claim 10, wherein the network device is configured to provide part or all of a digital part of a physical (PHY) layer function of an access point (AP) without providing an analog part of the PHY layer function of the AP.

15. The network device of claim 10, wherein the error indicates that the received packet includes one or more packet words received later than an expected time, and wherein the deframer is further configured to alter the received packet by adding one or more null packet words to the packet.

16. A method, comprising:
transmitting a synchronization signal from a network device to each of a plurality of radio heads;
receiving, at the plurality of radio heads via wireless communication, first packets from a wireless device;
forwarding, based on the first packets, second packets from the plurality of radio heads to the network device;
upon detecting that a received packet from a first radio head of the plurality of radio heads includes an error that can lead to a loss of synchronization between a master clock of the network device and a local clock of the first radio head, altering the received packet to prevent the error from leading to the loss of synchronization; and
transmitting data contained within the altered received packet.

17. The method of claim 16, wherein the received packet includes a data portion and a frame check sum (FCS) portion, and wherein the error indicates that the data portion includes one or more erroneous packet words, and wherein the method further comprises removing the FCS portion and transmitting only the data portion to the processor.

18. The method of claim 16, wherein the error indicates that the received packet is missing one or more packet words, and wherein the method further comprises altering the received packet by generating one or more null packet words to replace the missing one or more packet words.

19. The method of claim 16, wherein the error indicates that the received packet includes expected packet words and one or more unexpected packet words, and wherein the method further comprises altering the received packet by removing the unexpected packet words from the received packet and transmitting only the expected packet words to the processor.

20. The method of claim 16, wherein the error indicates that the received packet includes one or more packet words received later than an expected time, and wherein the method further comprises altering the received packet by adding one or more null packet words to the received packet.

* * * * *